(12) United States Patent
Cheng et al.

(10) Patent No.: US 11,764,265 B2
(45) Date of Patent: Sep. 19, 2023

(54) NANOSHEET TRANSISTOR WITH INNER SPACERS

(71) Applicant: International Business Machines Corporation, Armonk, NY (US)

(72) Inventors: Kangguo Cheng, Schenectady, NY (US); Ruilong Xie, Niskayuna, NY (US); Julien Frougier, Albany, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 17/382,289

(22) Filed: Jul. 21, 2021

(65) Prior Publication Data
US 2023/0029232 A1 Jan. 26, 2023

(51) Int. Cl.
*H01L 29/08* (2006.01)
*H01L 29/06* (2006.01)
(Continued)

(52) U.S. Cl.
CPC ...... *H01L 29/0847* (2013.01); *H01L 29/0665* (2013.01); *H01L 29/1608* (2013.01); *H01L 29/6653* (2013.01); *H01L 29/66545* (2013.01)

(58) Field of Classification Search
CPC ......... H01L 21/02603; H01L 21/28141; H01L 21/823431; H01L 21/823821; H01L 21/845; H01L 27/0886; H01L 27/0924; H01L 27/1211; H01L 29/0653; H01L 29/0665; H01L 29/0669; H01L 29/0673; H01L 29/0847; H01L 29/1608; H01L 29/41791; H01L 29/42392; H01L 29/66439; H01L 29/66545; H01L 29/6653; H01L 29/66553; H01L 29/6656; H01L 29/66795; H01L 29/775; H01L 29/785; H01L 29/7851; H01L 29/7853; H01L 29/7855; H01L 2029/7858
See application file for complete search history.

(56) References Cited

U.S. PATENT DOCUMENTS 10,014,390 B1 7/2018 Bouche
10,243,043 B2 3/2019 Mochizuki
(Continued)

*Primary Examiner* — David C Spalla
(74) *Attorney, Agent, or Firm* — David K. Mattheis

(57) ABSTRACT

A field effect transistor (FET) structure upon a substrate formed by forming a stack of nanosheets upon a semiconductor substrate, the stack including alternating layers of a compound semiconductor material and an elemental semiconductor material, forming a dummy gate structure upon the stack of nanosheets, recessing the stack of nanosheets in alignment with the dummy gate structure, recessing the compound semiconductor layers beyond the edges of the dummy gate, yielding indentations between adjacent semiconductor nanosheets. Further by filling the indentations with a bi-layer dielectric material, epitaxially growing source/drain regions adjacent to the nanosheet stack and bi-layer dielectric material, removing remaining portions of the compound semiconductor nanosheet layers, recessing the bi-layer dielectric material to expose an inner material layer, and forming gate structure layers in contact with first and second dielectric materials of the bi-layer dielectric material.

19 Claims, 9 Drawing Sheets

(51) Int. Cl.
*H01L 29/16* (2006.01)
*H01L 29/66* (2006.01)

(56) References Cited

U.S. PATENT DOCUMENTS

| | | |
|---|---|---|
| 10,269,983 B2 | 4/2019 | Frougier |
| 10,553,696 B2 | 2/2020 | Ando |
| 10,600,889 B2 | 3/2020 | Cheng |
| 10,679,906 B2 | 6/2020 | Cheng |
| 10,756,175 B2 | 8/2020 | Lee |
| 10,818,792 B2 | 10/2020 | Frougier |
| 10,861,952 B2 | 12/2020 | Ching |
| 10,903,317 B1 * | 1/2021 | Frougier ............. H01L 29/0653 |
| 10,930,795 B2 * | 2/2021 | Chen ................... H01L 29/0673 |
| 10,943,989 B2 | 3/2021 | Wu |
| 2019/0058052 A1 | 2/2019 | Frougier |
| 2019/0252516 A1 | 8/2019 | Cheng |
| 2021/0028297 A1 | 1/2021 | Yao |
| 2021/0036144 A1 | 2/2021 | Liaw |
| 2021/0234018 A1 * | 7/2021 | Xie ................... H01L 29/66553 |
| 2021/0336034 A1 * | 10/2021 | Wu ................... H01L 29/78696 |

\* cited by examiner

NANOSHEET TRANSISTOR WITH INNER SPACERS

BACKGROUND

The disclosure relates generally to nanosheet transistors. The disclosure relates particularly to nanosheet transistors having inner spacers isolating the transistor gate from the source/drain.

Continued innovations in semiconductor process technologies are enabling higher integration densities and device scaling. As the semiconductor industry moves beyond the 5 nanometer (nm) technology node and beyond, planar and non-planar semiconductor device structures, such as field-effect transistors (FETs) (e.g., metal-oxide-semiconductor FETs (MOSFETs)), must be scaled to smaller dimensions to provide increased device width per footprint area. In this regard, nanosheet (or nanowire) FET devices are considered to be a viable option for continued scaling. In general, a nanosheet FET device comprises a device channel having a nanosheet stack comprising one or more nanosheet layers, with each nanosheet layer having a vertical thickness that is substantially less than the width of the nanosheet layer. A common gate structure may be formed above and below each nanosheet layer in a stacked configuration, thereby increasing the FET device width (or channel width). Accordingly, such nanosheet FET devices may increase the drive current for a given footprint area.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

Aspects of the disclosed invention relate to a field effect transistor (FET) structure upon a substrate formed by forming a stack of nanosheets upon a semiconductor substrate, the stack comprising alternating layers of a compound semiconductor material and an elemental semiconductor material, forming a dummy gate structure upon the stack of nanosheets, recessing the stack of nanosheets in alignment with the dummy gate structure, recessing the compound semiconductor layers beyond the edges of the dummy gate, yielding indentations between adjacent semiconductor nanosheets, filling the indentations with a bi-layer dielectric material, epitaxially growing source/drain regions adjacent to the nanosheet stack and bi-layer dielectric material, removing remaining compound semiconductor nanosheet layers, recessing the bi-layer dielectric material to expose an inner material layer, and forming gate structure layers in contact with first and second dielectric materials of the bi-layer dielectric material.

Aspects of the disclosed invention relate to a field effect transistor (FET) structure including a plurality of semiconductor nanosheets disposed in a vertical stack above a substrate, source/drain regions disposed on opposing sides of the semiconductor nanosheets, gate structure layers disposed between otherwise adjacent nanosheets, and inner spacers disposed between the source/drain regions and the gate structure layers, the inner spacers comprising a first dielectric material layer disposed between upper and lower layers of a second dielectric material, the first dielectric material layer disposed in contact with the gate structure layers and the source/drain regions.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
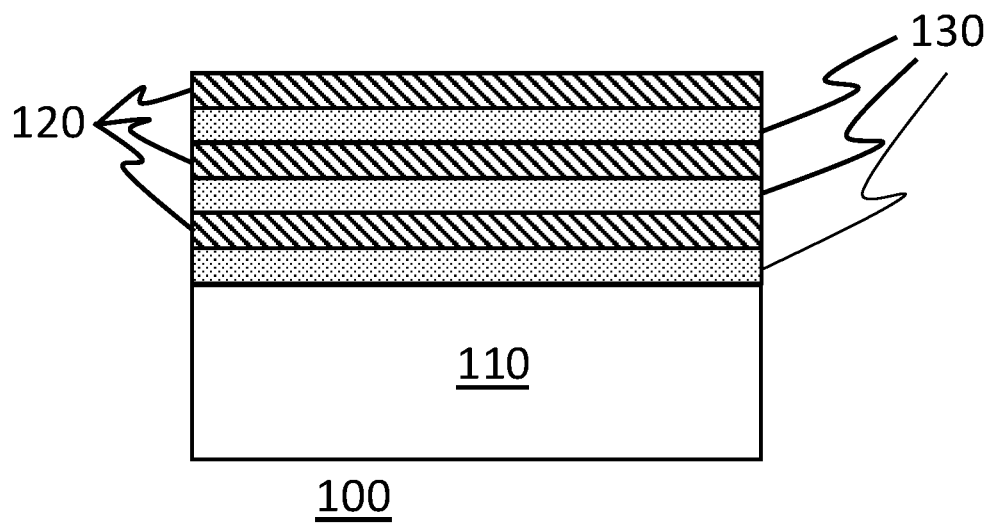
FIG. 1 provides a cross-sectional view of a step in the fabrication of a semiconductor device, according to an embodiment of the invention. The figure illustrates the device after deposition of alternating nanosheet layers of compound semiconductor and semiconductor layer upon a substrate.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal materials and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25 C. about 900 C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Nanosheet (NS) transistors are being pursued as a viable device architecture for scaling CMOS devices beyond 5 nm node. One challenge in fabricating NS transistors is the difficulty forming inner spacers to isolate the gate from the source/drain regions. In conventional NS spacer formation, the sacrificial material (e.g., SiGe) between NS (e.g., Si) is laterally etched to create a small divot between adjacent NS tips. The divot is then filled by a conformal deposition to pinch off the divot, followed by a selective etch back to expose the NS tips so that epitaxial source/drain regions can be formed at NS tips. The initial SiGe etch is done by a timed etch. It has been found that, the resulting inner spacer has a non-ideal profile (so-called 'half-moon' shape). When the sacrificial SiGe layers are removed to release silicon nanosheet channel before replacement gate (RMG) formation, the non-ideal inner spacer profiles have caused undesired etch of the source/drain of pFET. Disclosed embodiments enable the formation of inner spacers which reduce the likelihood of the undesired S/D region losses during the etching to release the Si NS.

This invention provides a method and structure for forming inner spacers for nanosheet (NS) transistors with improved inner spacers. After forming a dummy gate structure and recessing the NS stack in the source/drain region, the sacrificial SiGe layers in NS stack is laterally indented beyond the edges the final gate. In other words, SiGe is over-etched towards channel. The over-indented cavities are filled with bi-layer dielectric (e.g., SiN followed by SiBCN) to form inner spacer. Due to the over-indentation, the lateral width of the inner spacer is increased, thus improving isolation between the epitaxial source/drain and the sacrificial SiGe in NS stack in channel region.

After forming the inner spacers, epitaxially growing source/drain regions in contact with the Si NS, removing the dummy gate, and removing the sacrificial SiGe in the channel region, the first layer of the inner spacer (e.g., SiN) next to channel region is exposed by removal of a portion of the bi-layer spacer. An isotropic etch is performed to remove the exposed SiN to recover the gate length lost due to over-indentation during the inner spacer fabrication process. A High-k/metal gate is then formed followed by gate and S/D contact formation.

Reference is now made to the figures. The figures provide schematic cross-sectional illustration of semiconductor devices at intermediate stages of fabrication, according to one or more embodiments of the invention. The device provides schematic representations of the devices of the invention and are not to be considered accurate or limiting with regards to device element scale.

FIG. 1 provides a cross-sectional view of a device 100 according to an embodiment of the invention at a first intermediate stage of fabrication. For the purpose of clarity, several fabrication steps leading up to the production of the semiconductor structure as illustrated in FIG. 1 are omitted. In other words, the semiconductor structure does not necessarily start out in the form illustrated in FIG. 1, but may develop into the illustrated structure over one or more well-known processing steps which are not illustrated but are well-known to those of ordinary skill in the art. As shown in the Figure, alternating nanosheets of a sacrificial compound semiconductor material 130 and elemental semiconductor material 120 are disposed upon an underlying semiconductor substrate 110 and an optional buffer layer (not shown).

The semiconductor substrate 110 may include any semiconductor material including, for example, silicon. The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (SiGeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. In one embodiment, the optional buffer is comprised of a III-V compound (e.g., alloy). For example, optional buffer may be comprised of gallium arsenide phosphide ($GaAs_{1-x}P_x$). However, the optional buffer may be comprised of any material suitable for use in accordance with the embodiments described herein.

In an embodiment, the nanosheet stack is comprised of alternating nanosheet layers. For example, as shown in FIG. 1, the nanosheet stack comprises first nanosheet layers 120 comprising a first material and second nanosheet layers 130 comprising another material. In general, the nanosheet stack structure comprises second nanosheet layers 130 disposed between adjacent first nanosheet layers 120. Each nanosheet layer of nanosheet stack may have a thickness ranging from about 3 nm to about 20 nm, although thinner or thicker nanosheets are also possible.

The nanosheet stack can be formed by epitaxially growing the nanosheet stack with the second nanosheet layers 130 between adjacent first nanosheet layers 120. In one embodiment, first nanosheet layers 120 are comprised of silicon. In another embodiment, second nanosheet layers 130 can be comprised of $Si_xGe_y$, where x and y represent relative atomic concentration of silicon (Si) and germanium (Ge), respectively. X and y are less than 1 and their sum is equal to 1. In some embodiments, x is equal to 0.75 and y is equal to 0.25.

Figure 2:
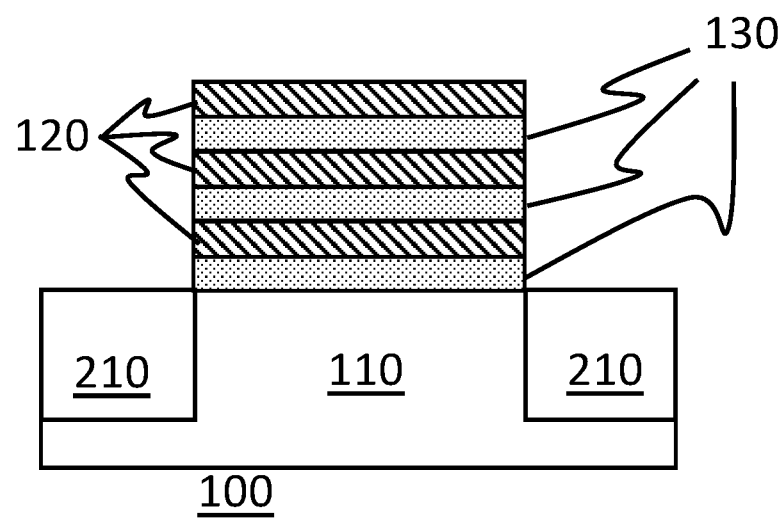
FIG. 2 provides a cross-sectional view of a step in the fabrication of a semiconductor device, according to an embodiment of the invention. The figure illustrates the device after patterning and etching of the nanosheet layers and the deposition of shallow trench isolation materials between etched portions.

FIG. 2 provides a cross-sectional view of a device 100 according to an embodiment of the invention at a second intermediate stage of fabrication. As shown in the Figure, the layers of the nanosheet stack have been patterned and selectively etched using lithographic techniques and etching process such as reactive ion etching (RIE). The etching proceeds into substrate 110. Deposition of a shallow trench isolation material 210, such as silicon dioxide, or any suitable combination of multiple dielectric materials (e.g., silicon nitride and silicon oxide), occurs after the formation of shallow trench isolation (STI) regions 210 between NS stack circuit elements of the device. Following such deposition, an oxide recess process trims the upper surface of STI regions 210 to the level of the underlying substrate 110, and chemical mechanical planarization (CMP) processes smooth the upper surface of STI regions 210 in preparation for the subsequent fabrication steps. STI regions 210 provide electrical isolation between source/drain regions of adjacent NS transistors.

Figure 3:
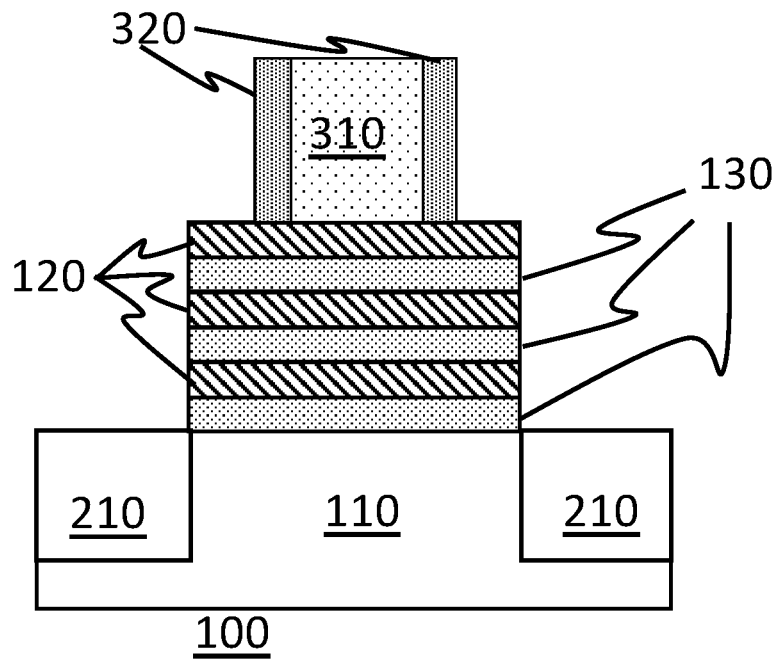
FIG. 3 provides a cross-sectional view of a step in the fabrication of a semiconductor device, according to an embodiment of the invention. The figure illustrates the device after the formation of a dummy gate structure including a dummy gate and protective sidewalls.

FIG. 3 illustrates the device 100 at a third intermediate stage of fabrication. As shown in the figure, a dummy gate structure including dummy gate 310 and protective sidewall spacers 320 has been formed above the nanosheet stack. In some embodiments, the dummy gate includes a dummy gate dielectric (e.g., silicon oxide) and a dummy gate placeholder (e.g., amorphous silicon). The dummy gate may further comprise hardmask layer (e.g., silicon nitride) at the top. After depositing the dummy gate stack, it is patterned (e.g., by RIE). The protective sidewall spacers 320 may comprise any suitable dielectric material(s), for example, SiOCN. The sidewall spacers 320 can be formed by deposition followed by RIE. In some embodiments, the lateral width of each spacer is about 6 nm.

Figure 4:
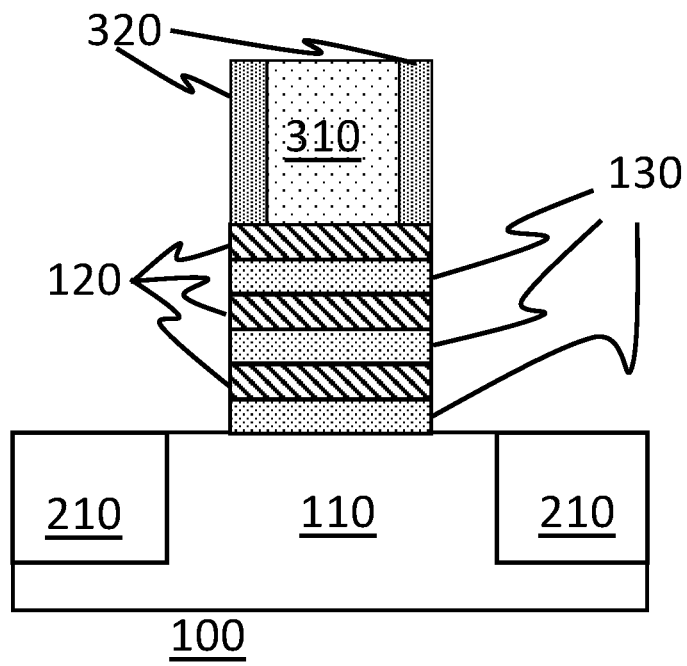
FIG. 4 provides a cross-sectional view, of a step in the fabrication of a semiconductor device, according to an embodiment of the invention. The figure illustrates the device after the selective etching of the nanosheet layers forming stacks aligned with the dummy gate structure.

FIG. 4 illustrates device 100 at a fourth intermediate stage of fabrication. As shown in the Figure, nanosheets 120 and 130 have been selectively etched back to a cross-section matching that of the dummy gate 310 and protective sidewall spacers 320 using an etching method such as RIE.

Figure 5:
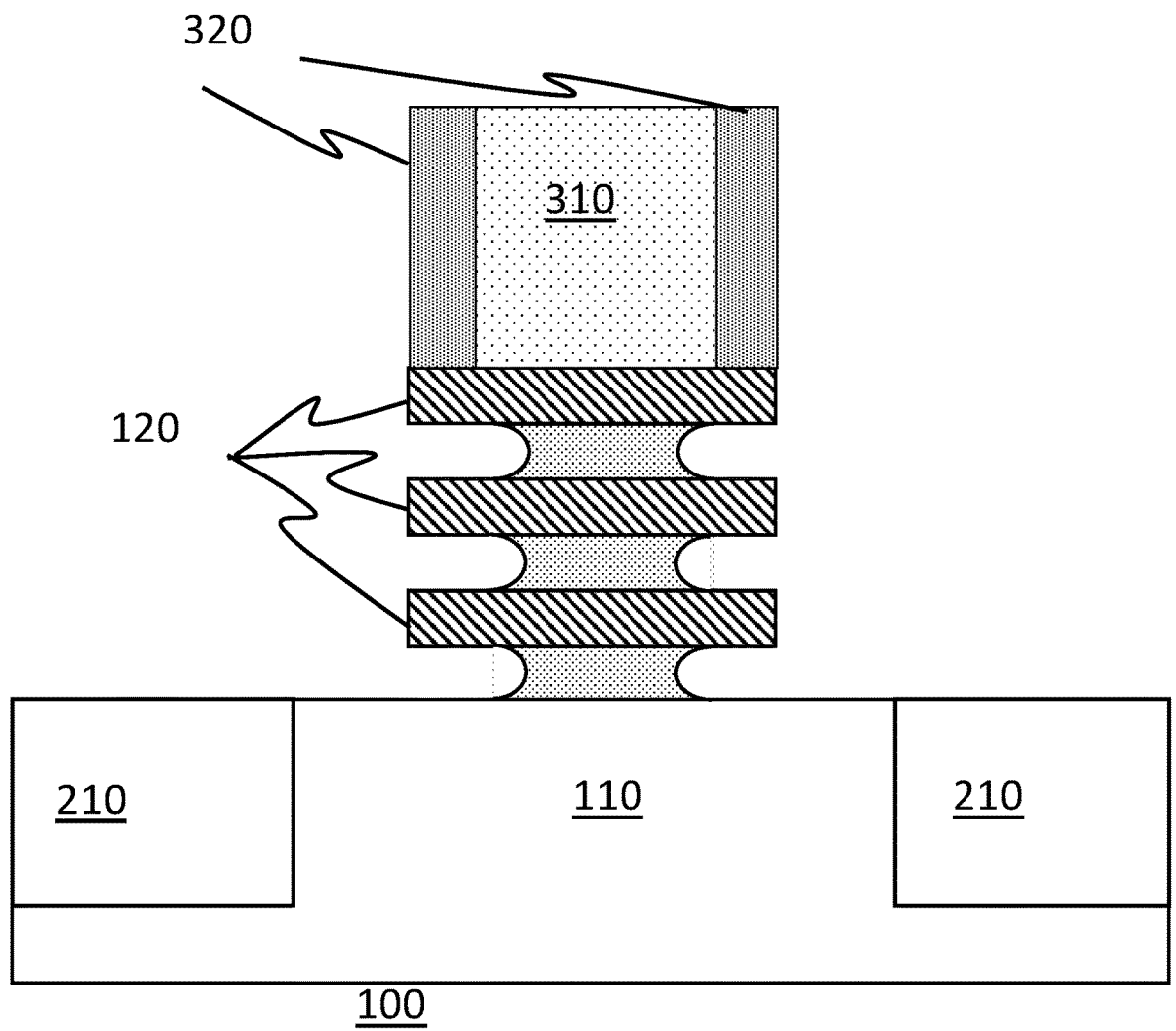
FIG. 5 provides a cross-sectional view of a step in the fabrication of a semiconductor device, according to an embodiment of the invention. The figure illustrates the device after the selective removal of portions of the compound semiconductor layers yielding indentations beyond edges of the dummy gate.

FIG. 5 illustrates device 100 at a fifth intermediate stage of fabrication. As shown in the Figure, second nanosheet layers 130 have been are laterally etched to form divots between substrate 110 and first nanosheet layer 120 as well as divots between adjacent first nanosheet layers 120. The lateral etching of second nanosheet layers 130 may be performed using, for example, an isotropic etch such as gas phase etch, plasma etch, or wet etch. For example, in the case where the second nanosheet layers comprise $Si_{0.75}Ge_{0.25}$, the lateral etch selectively removes a portion of the high Ge % (i.e., $Si_{0.75}Ge_{0.25}$) sacrificial layer form the divots. The etch process for the case of SiGe can be, for example, gas phase hydrogen chloride (HCl) etch, a wet etch process containing a mix of ammonia and hydrogen peroxide, or a dry etch such as plasma etch. In an embodiment, the etching to form the divots comprises a vertical etching of about 10 nm and a lateral etching of about 10 nm, although other dimensions are also practicable. Note that over-indentation is performed, such that the leading edge of the divot after etching the SiGe extends beyond the edge of the dummy gate. Non-ideal curved ("half-moon") indentation leading edge profile is shown. Over-indentation increases the inner spacer width from the outer edge of the nanosheets to the leading edge of the spacer, and thus advantageously improves isolation between epitaxial source/drain and sacrificial SiGe in the NS stack.

Figure 6:
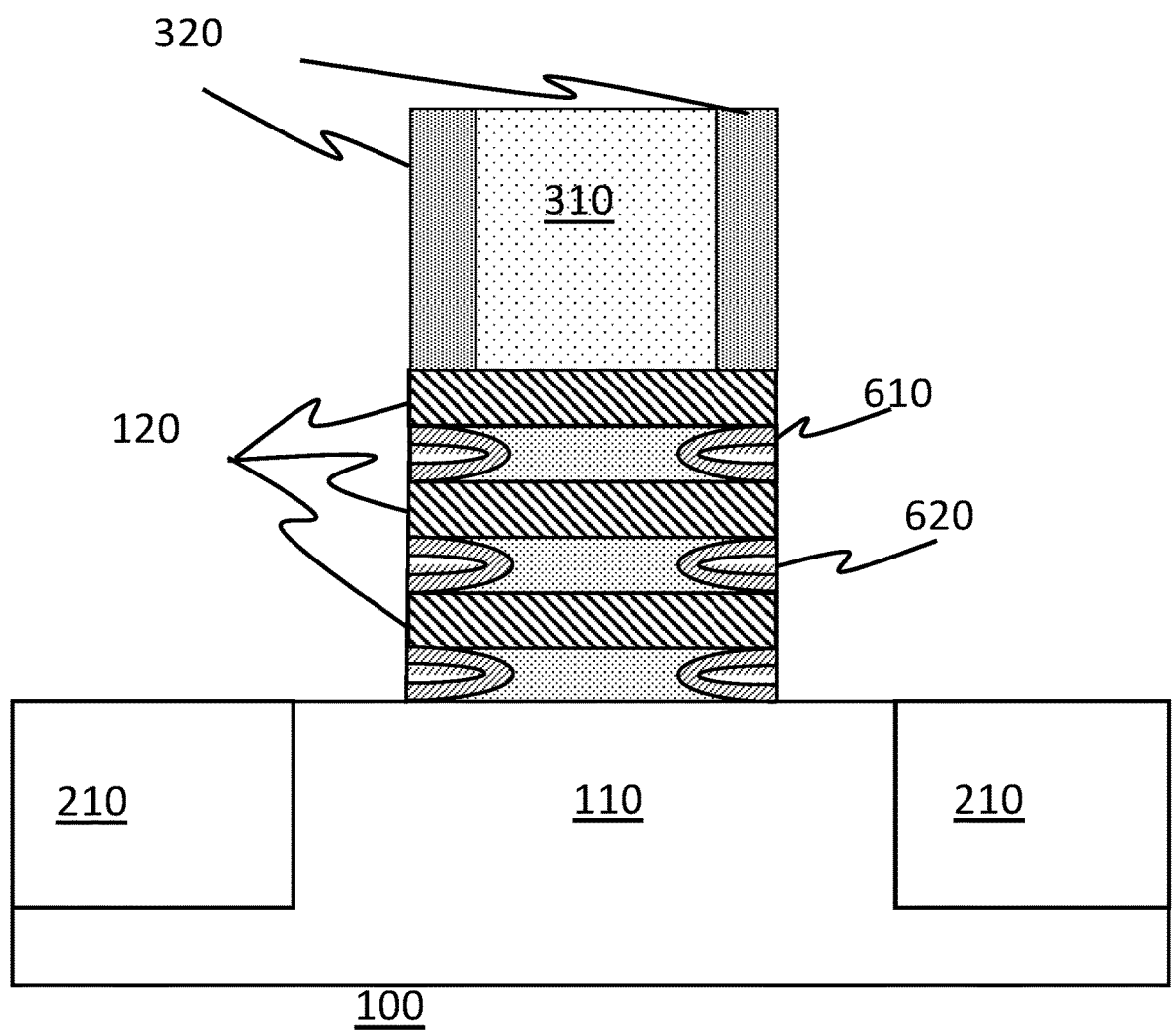
FIG. 6 provides a cross-sectional view of a step in the fabrication of a semiconductor device, according to an embodiment of the invention. The figure illustrates the device after the deposition of bi-layer dielectric spacer material within the indentations.

FIG. 6 illustrates device 100 at a sixth intermediate fabrication stage. As shown in the figure, the divots have been filled with a bi-layer structure followed by an etching process to smooth the vertical surfaces of the NS stacks. Formation of the bi-layer fill includes conformal deposition of a first dielectric material 610, such as silicon nitride to a thickness of about 3 nm, followed by conformal deposition of a second dielectric material 620 such as silicon boron carbon nitride (SiBCN), to a thickness completely filling the divots. The etch back process removes excess SiN and SiBCN from the vertical surfaces of the NS stack and the horizontal surfaces of substrate 110 and STI 210.

Figure 7:
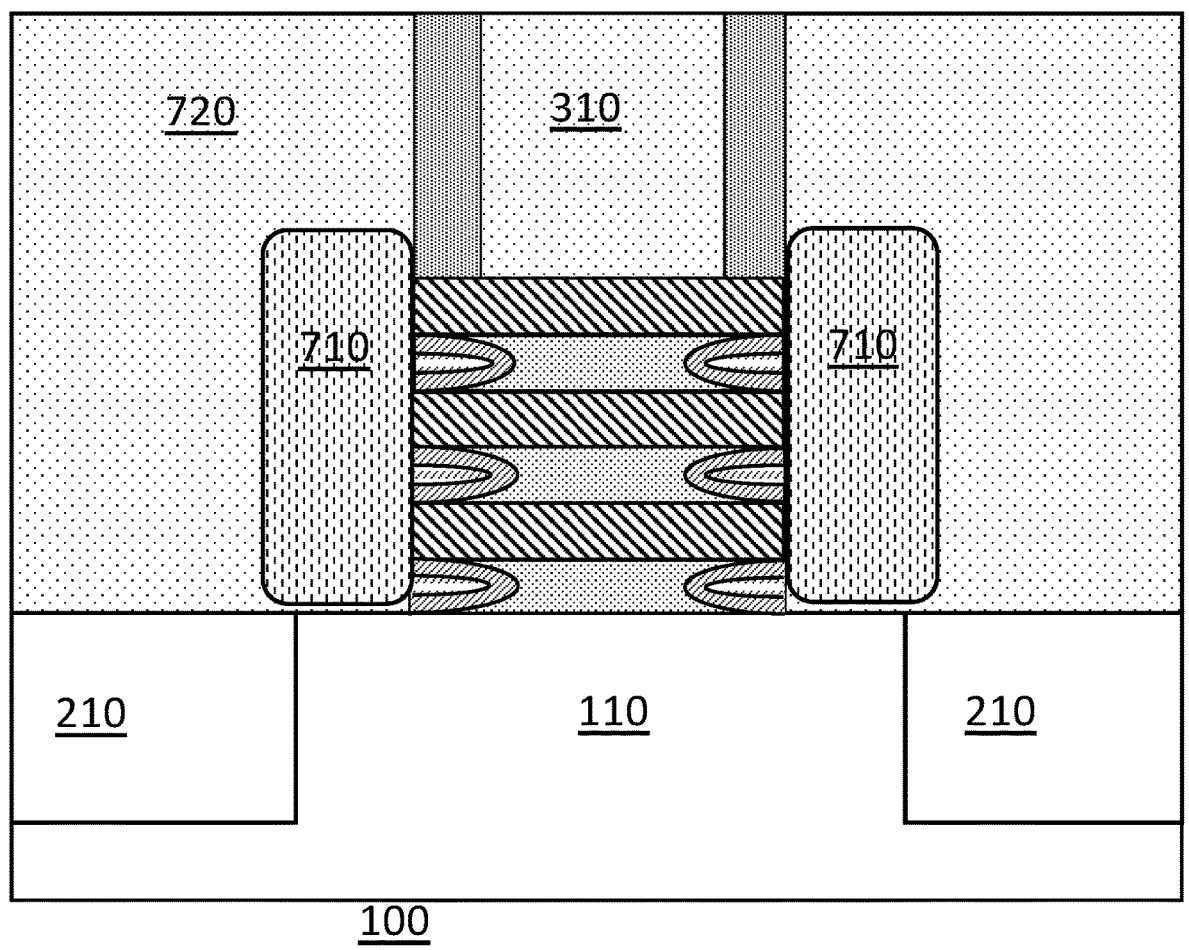
FIG. 7 provides a cross-sectional view of a step in the fabrication of a semiconductor device, according to an embodiment of the invention. The figure illustrates the device after the fabrication of source and drain regions adjacent to the nanosheet stack and bilayer dielectric spacer materials and the deposition of an interlayer dielectric material.

FIG. 7 illustrates device 100 at a seventh intermediate stage of fabrication. As shown in the Figure, source and drain regions (source/drain, or S/D) 710 have been epitaxially grown in contact with the outer edges of nanosheets 120 as well as inner spacer dielectric layers 610 and 620.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed, e.g., the Si nanosheets 120 of the device.

In the present embodiments, the source-drain regions 710 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

As shown in FIG. 7, deposition and planarization of an interlayer dielectric material 720, such as silicon oxide, silicon nitride, encapsulates the NS stack, S/D regions 710, and dummy gate sidewalls 320.

Figure 8:
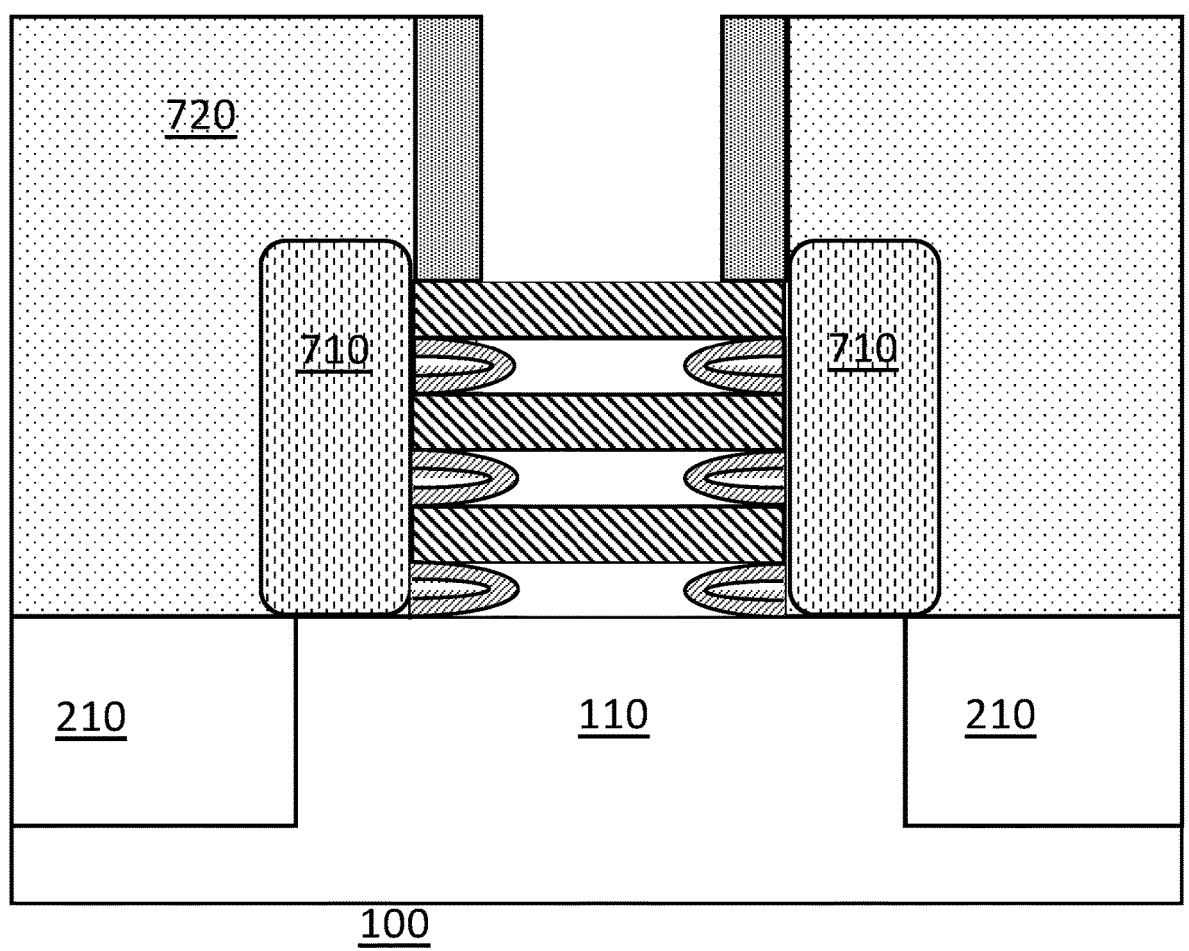
FIG. 8 provides a cross-sectional view of a step in the fabrication of a semiconductor device, according to an embodiment of the invention. The figure illustrates the device after the removal of the dummy gate and remaining portions of the compound semiconductor nanosheet layers.

FIG. 8 illustrates device 100 at an eighth intermediate stage of fabrication. As shown in the Figure, dummy gate 310 and the remaining portions of second nanosheet layers 130 have each removed from the intermediate device structure. The dummy gate 310 can be removed using a plasma etch, a wet etch, or a combination of both, for example, to form a void in the gate region. Portions of second nanosheet layers 130 can be removed by using any suitable selective etching processes, for example, by a gas phase etch containing HCl to etch SiGe. Elongated spacer layers 610 and 620 as a result of over-indentation protect S/D regions 710 from exposure to the active etching process.

Figure 9:
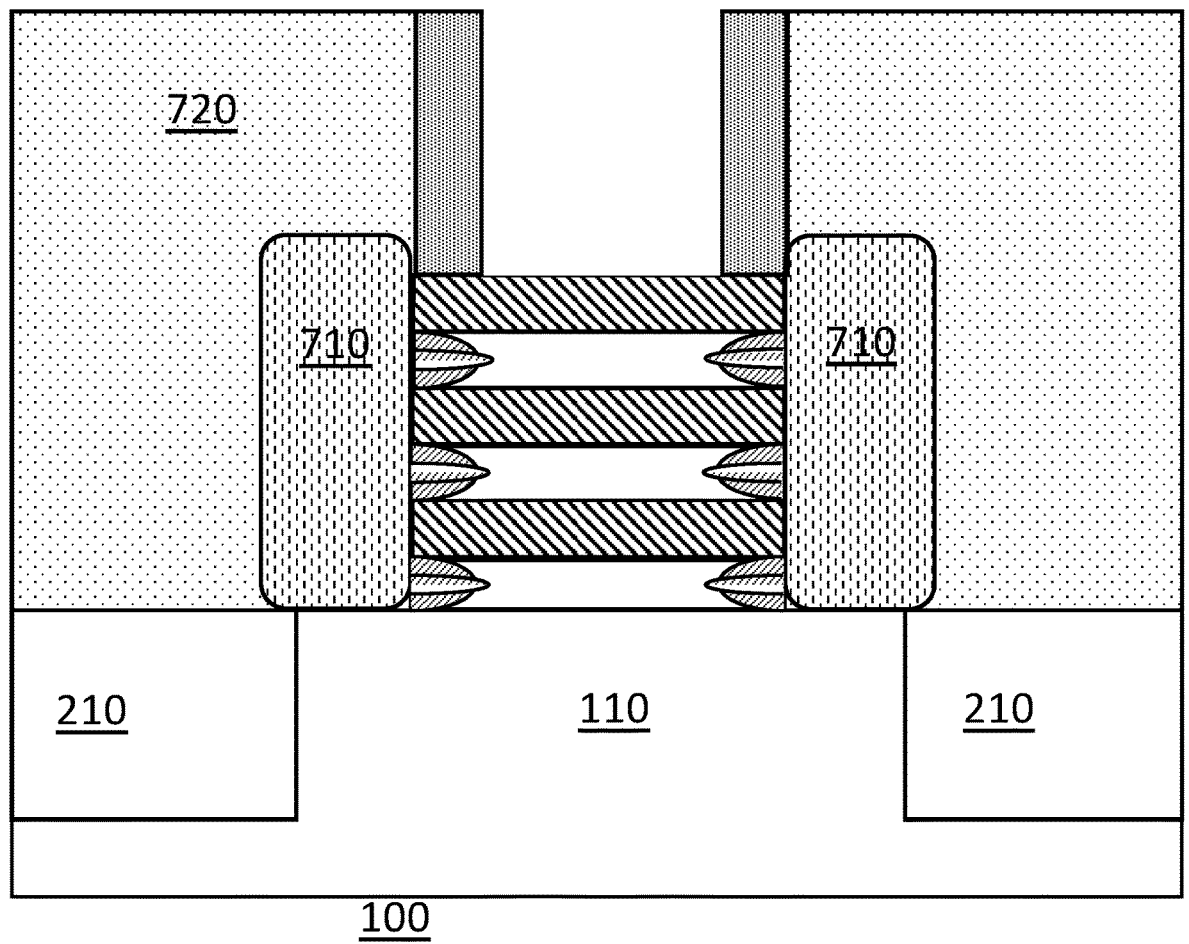
FIG. 9 provides a cross-sectional view of a step in the fabrication of a semiconductor device, according to an embodiment of the invention. The figure illustrates the device after the recessing of the bi-layer dielectric materials to reveal the inner layer of dielectric material and to recover gate length.

FIG. 9 illustrates device 100 at a ninth intermediate stage of fabrication. As shown in the Figure, selective etching of first dielectric spacer material 610, exposes the second dielectric spacer material 620, and recovers gate length lost during previous inner spacer lateral etching fabrication steps. As an example, a hot phosphoric acid etch provides a selective etching ratio exceeding 10:1 for SiN relative to SiBCN layers, and epitaxial source/drains.

Figure 10:
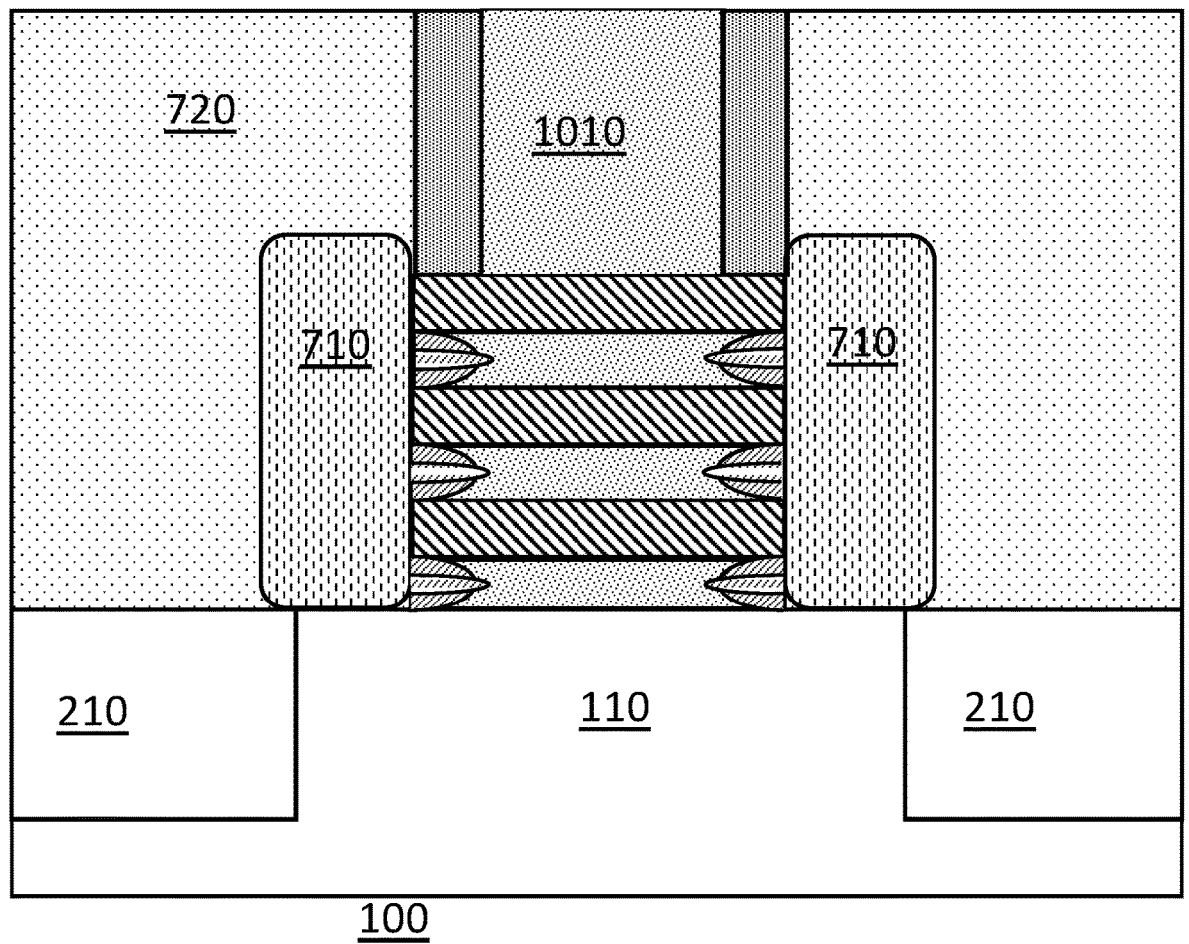
FIG. 10 provides a cross-sectional view of a step in the fabrication of a semiconductor device, according to an embodiment of the invention. The figure illustrates the device after the formation of a high-k/metal gate for the device.

FIG. 10 illustrates device 100 at a tenth intermediate stage of fabrication. As shown in the Figure, a replacement metal gate structure has been formed in the void space created by removal of the dummy gate 310. Gate structure 1010 includes gate dielectric and gate metal layers (not shown). The gate dielectric is generally a thin film and can be silicon oxide, silicon nitride, silicon oxynitride, boron nitride, SiOCN, SiBCN, SiOC, SiCN, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. Gate dielectric can be deposited by CVD, ALD, or any other suitable technique. Metal gate can include any known metal gate material known to one skilled in the art, e.g., tantalum (Ta), tungsten (W), ruthenium (Ru), titanium nitride (TiN), and tantalum nitride (TaN). The metal gate may be formed via known deposition techniques, such as atomic layer deposition, chemical vapor deposition, or physical vapor deposition. It should be appreciated that a chemical mechanical planarization (CMP) process can be applied to the top surface.

Back-end-of-line processes following the formation of the nanosheet structures include the formation of contact electrodes for the gate and source/drain regions of the nanosheet device through the deposition, selective patterning and electrical isolation of conductive material in contact with the gate and source/drain upper contacts.

Figure 11:
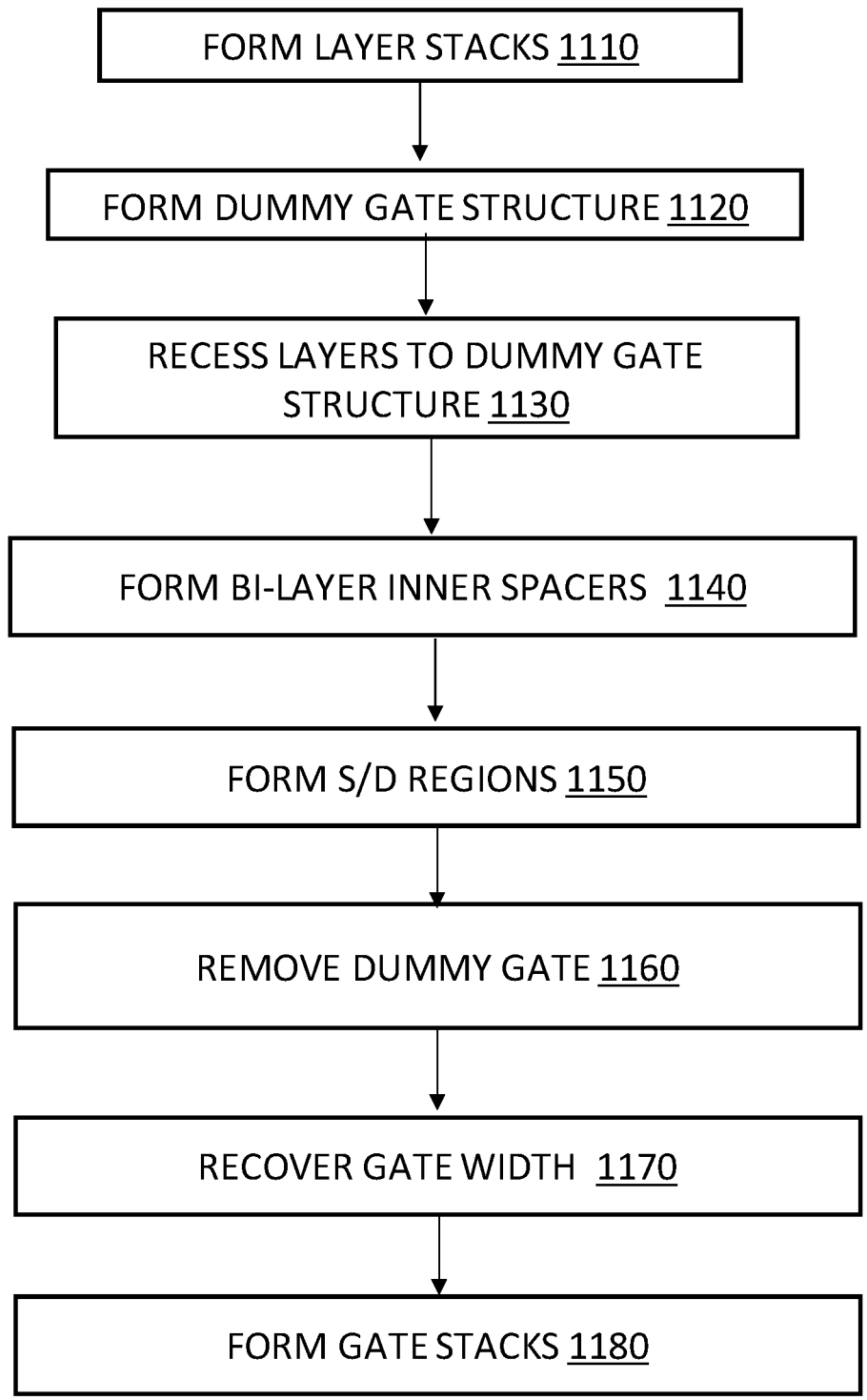
FIG. 11 provides a flowchart depicting operational steps for forming semiconductor device, according to an embodiment of the invention.

FIG. 11 depicts flowchart 1100, listing representative fabrication steps for devices according to an embodiment of the invention. At block 1110, NS stacks are formed from alternating material layers such as an elemental semiconductor (e.g., Si) for the device nanosheets, and a compound semiconductor (e.g., SiGe) for the interleaved sacrificial spacer nanosheet layers. The stack of formed layers may be patterned and selectively etched wherein the etching proceeds into the underlying substrate creating trenches for deposition of shallow trench isolation materials, such as silicon dioxide.

At block 1120, dummy gate structures are formed above the patterned nanosheet stacks. The dummy gate structures include a dummy gate replicating the physical dimensions of the actual metal gate elements, and protective sidewall cladding adjacent to the dummy gates.

At block 1130, the NS stacks are further selectively etched to match the cross section of the dummy gate and sidewall structure.

At block 1140, bi-layer inner spacers are formed. Portions of sacrificial nanosheet layers are laterally etched away to an extent beyond the edges of the dummy gate. The divots formed by the lateral etching are then filled through a combination of conformal deposition processes. A first process partially fills the divots with a first dielectric material such as SiN, and a second deposition process completely fills the divots with a second dielectric material such as SiBCN. Subsequent etching removes excess dielectric materials from NS stack vertical surfaces and STI and substrate horizontal surfaces.

At block 1150, doped source/drain regions are epitaxially grown upon the exposed edges of the Si nanosheets and in contact with the inner spacer layers. In an embodiment, the source/drain regions extend to contact all of the nanosheets of the stack.

At block 1160, the dummy gate is removed to create a void space for the formation of the replacement metal gate structure. Selective etching removes the material of the dummy gate and the remaining material of the sacrificial nanosheet layers between adjacent device nano sheets.

At block 1170, selective etching, such as a phosphoric acid etch, selectively removes the first inner spacer layer, and exposes the second inner spacer layer while recovering gate length between adjacent nanosheets, previously lost during the formation of inner spacer divots.

At block 1180, replacement metal gate structures are formed including a thin film dielectric and a work function metal gate element. The gate elements are formed in the voids created by the removal of the dummy gate as well as the removal of the sacrificial layers. The gate structures are formed in contact with the first and second dielectric materials of the inner spacers.

In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG, the HKMG can be optionally recessed followed by a deposition and CMP of a gate dielectric material completes the replacement metal gate fabrication stage for the device.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A field effect transistor (FET) structure comprising:
a plurality of semiconductor nanosheets disposed in a vertical stack above a substrate, source/drain regions disposed on opposing sides of the semiconductor nanosheets;
gate structure layers disposed between otherwise adjacent semiconductor nanosheets; and
inner spacers disposed between the source/drain regions and the gate structure layers, the inner spacers comprising a first dielectric material layer disposed between upper and lower layers of a second dielectric material, the first dielectric material layer disposed in contact with the gate structure layers and the source/drain regions, wherein the first dielectric material layer extends further into the gate structure layer than the second dielectric material layers.

2. The FET structure according to claim 1 wherein the upper and lower layers of the second dielectric material are disposed in contact with the gate structure layers and the source/drain region.

3. The FET structure according to claim 1, wherein the source/drain regions comprise an epitaxial layer in contact with the semiconductor nanosheets.

4. The FET structure according to claim 1, further comprising a gate electrode in contact with the gate structure layers.

5. The FET structure according to claim 1, further comprising an upper gate structure disposed adjacent to and above an uppermost nanosheet.

6. The FET structure according to claim 5, further comprising sidewalls disposed adjacent to the upper gate structure.

7. A method of making a field effect transistor (FET) structure, the method comprising:
forming a stack of nanosheets, the stack comprising alternating layers of a compound semiconductor material and an elemental semiconductor material;
forming a dummy gate structure upon the stack of nanosheets;
recessing the stack of nanosheets in alignment with the dummy gate structure;
recessing the compound semiconductor layers beyond the edges of the dummy gate, yielding indentations between adjacent semiconductor nanosheets;
filling the indentations with a bi-layer dielectric material;
epitaxially growing source/drain regions adjacent to the nanosheet stack and bi-layer dielectric material;
removing remaining compound semiconductor nanosheet layers;
recessing the bi-layer dielectric material to expose an inner material layer; and
forming gate structure layers in contact with first and second dielectric materials of the bi-layer dielectric material wherein the first dielectric material layer extends further into the gate structure layer than the second dielectric material layers.

8. The method of making a field effect transistor (FET) structure according to claim 7, wherein the elemental semiconductor material comprises Silicon.

9. The method of making a field effect transistor (FET) structure according to claim 7, wherein the compound semiconductor material comprises SiGe.

10. The method of making a field effect transistor (FET) structure according to claim 7, wherein filling the indentations with the bi-layer dielectric material comprises depositing a first dielectric material within the indentations and depositing a second dielectric material within the indentations adjacent to the first dielectric material.

11. The method of making a field effect transistor (FET) structure according to claim 7, further comprising forming sidewall spacers adjacent to the dummy gate structure.

12. The method of making a field effect transistor (FET) structure according to claim 7, wherein recessing the bi-layer material comprises recessing the bi-layer to align with gate structure edges.

13. The method of making a field effect transistor (FET) structure according to claim 7, further comprising forming sidewalls in contact with an upper gate structure layer.

14. A method of making a field effect transistor (FET) structure upon a substrate, the method comprising:
forming a stack of nanosheets upon a semiconductor substrate, the stack comprising alternating layers of a compound semiconductor material and an elemental semiconductor material;
forming a dummy gate structure upon the stack of nanosheets;
recessing the stack of nanosheets in alignment with the dummy gate structure;
recessing the compound semiconductor layers beyond the edges of the dummy gate, yielding indentations between adjacent semiconductor nanosheets;
filling the indentations with a bi-layer dielectric material;
epitaxially growing source/drain regions adjacent to the nanosheet stack and bi-layer dielectric material;
removing remaining compound semiconductor nanosheet layers;
recessing the bi-layer dielectric material to expose an inner material layer; and
forming gate structure layers in contact with first and second dielectric materials of the bi-layer dielectric material, wherein the first dielectric material layer extends further into the gate structure layer than the second dielectric material layers.

15. The method of making a field effect transistor (FET) structure according to claim 14, wherein the elemental semiconductor material comprises Silicon.

16. The method of making a field effect transistor (FET) structure according to claim 14, wherein the compound semiconductor material comprises SiGe.

17. The method of making a field effect transistor (FET) structure according to claim 14, wherein filling the indentations with the bi-layer dielectric material comprises depositing a first dielectric material within the indentations and depositing a second dielectric material within the indentations adjacent to the first dielectric material.

18. The method of making a field effect transistor (FET) structure according to claim 14, further comprising forming sidewall spacers adjacent to the dummy gate structure.

19. The method of making a field effect transistor (FET) structure according to claim 14, wherein recessing the bi-layer material comprises recessing the bi-layer to align with gate structure edges.

* * * * *